United States Patent
Bedeschi

(10) Patent No.: US 11,508,455 B1
(45) Date of Patent: Nov. 22, 2022

(54) SIGNAL DROP COMPENSATED MEMORY

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/343,348

(22) Filed: Jun. 9, 2021

(51) Int. Cl.
| | |
|---|---|
| G11C 7/00 | (2006.01) |
| G11C 29/42 | (2006.01) |
| G11C 11/4091 | (2006.01) |
| G11C 29/02 | (2006.01) |
| G11C 29/44 | (2006.01) |

(52) U.S. Cl.
CPC .......... *G11C 29/42* (2013.01); *G11C 11/4091* (2013.01); *G11C 29/024* (2013.01); *G11C 29/4401* (2013.01)

(58) Field of Classification Search
CPC ....................................................... G11C 29/42
See application file for complete search history.

(56) References Cited

U.S. PATENT DOCUMENTS

| | | | |
|---|---|---|---|
| 8,817,569 B2 | 8/2014 | Duzly et al. | |
| 9,514,811 B2 | 12/2016 | Chevallier et al. | |
| 9,720,611 B2* | 8/2017 | Siau | G11C 13/0023 |
| 9,754,640 B1 | 9/2017 | Yang | |
| 10,777,255 B2 | 9/2020 | Antonyan et al. | |
| 10,943,656 B2 | 3/2021 | Di Vincenzo et al. | |
| 2004/0141395 A1* | 7/2004 | Ohtsuki | G11C 7/1045 |
| | | | 365/210.1 |
| 2007/0019485 A1* | 1/2007 | Sumitani | G11C 7/22 |
| | | | 365/203 |
| 2012/0257464 A1* | 10/2012 | Moriwaki | G11C 11/419 |
| | | | 365/189.11 |
| 2015/0279448 A1 | 10/2015 | Thewes | |
| 2018/0114583 A1 | 4/2018 | Wang et al. | |

\* cited by examiner

*Primary Examiner* — Min Huang
(74) *Attorney, Agent, or Firm* — Brooks, Cameron & Huebsch, PLLC

(57) ABSTRACT

Apparatuses and methods for compensating for signal drop in memory. Compensating for signal drop can include applying a first signal to a terminal of a particular transistor and mirroring the first signal to a decoder replica. Compensating for signal drop can also include applying a second signal to a gate of the particular transistor, the second signal comprising a sensing signal and a signal drop on the decoder replica and sensing a state of the particular transistor.

21 Claims, 11 Drawing Sheets

SIGNAL DROP COMPENSATED MEMORY

TECHNICAL FIELD

The present disclosure relates generally to memory, and more particularly to apparatuses and methods associated with signal drop compensated memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices. The memory can include sensing circuitry. The sensing circuitry can be configured to sense a state of memory cells of the array of the memory.

DETAILED DESCRIPTION

Figure 1:
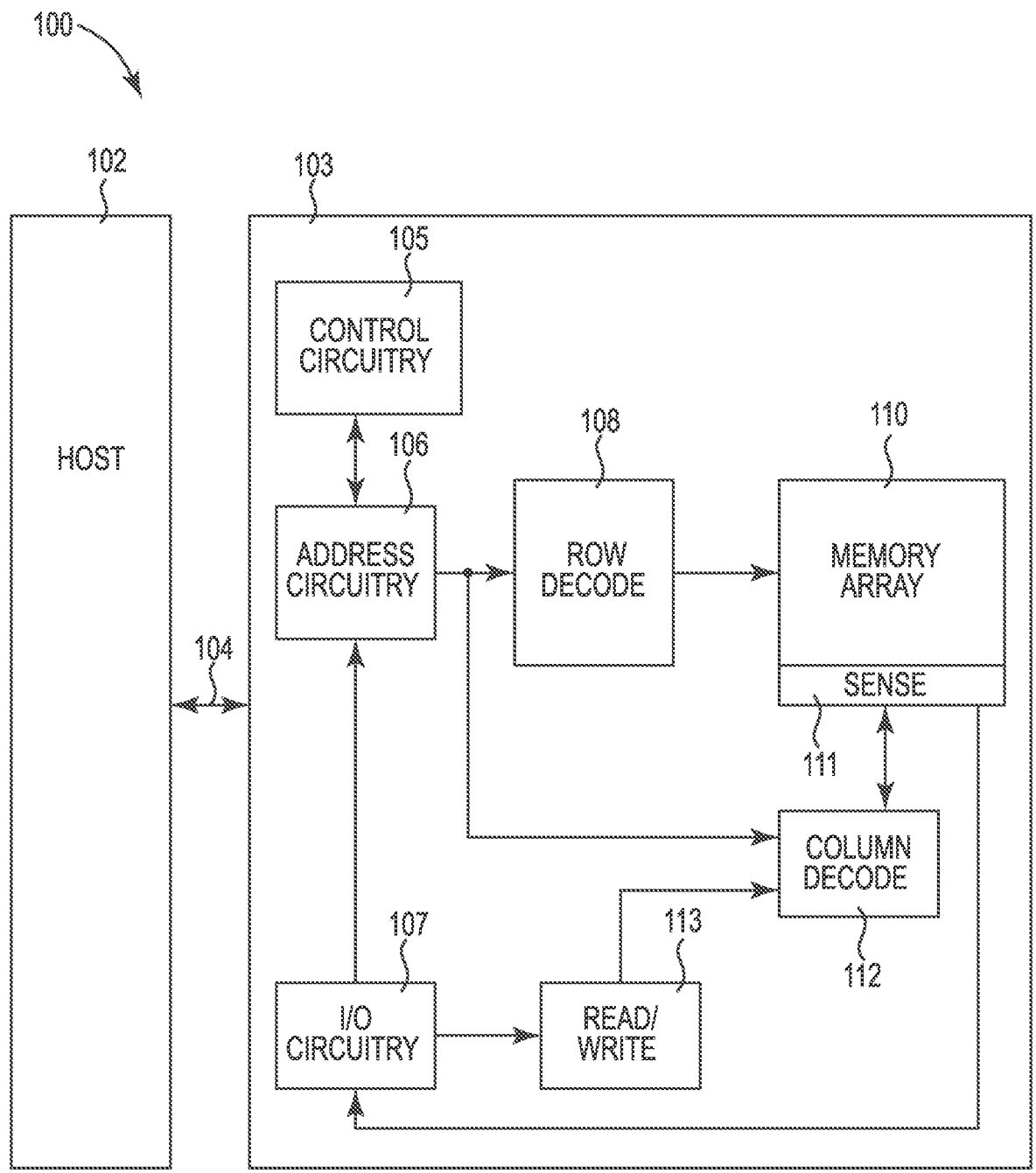
FIG. 1 is a block diagram of an apparatus in the form of a computing system including a memory device in accordance with a number of embodiments of the present disclosure.

The present disclosure includes apparatuses and methods related to compensating for signal drop in memory. The signal drop can occur in the sensing circuitry of the memory device. Signal drop in the sensing circuitry can cause the sensing circuitry to incorrectly determine a state of memory cells that provided the signal.

A sense amplifier of the sensing circuitry can bias array lines. For example, the sensing circuitry can bias a sense line (e.g., bit line) and/or a select line (e.g., word line) with a static cascode. A cascode can be a two-stage amplifier consisting of a common-emitter stage feeding into a common-base stage. Static cascodes are useful to reject supply noise. However, static cascodes suffer from an output resistance. The output resistance can leak a current of an output of the sensing circuitry. As used herein, a leak is a difference between a target output and an actual output of the sensing circuitry and/or any portion of the sensing circuitry. A cascode can be implemented in a decoder of the sensing circuitry. As used herein, the cascode can be implemented as a decoder in the sensing circuitry which comprises a transistor and precharge circuitry.

A current leakage can increase as a threshold voltage of a transistor is approached. A voltage drop can be associated with a current leakage. As the threshold voltage is approached a voltage drop can be experienced over the decoder, which in turn reduces a voltage of a transistor of the sensing circuitry. Reducing the output resistance of a feedback amplifier (e.g., NOR flash cascode) may reduce the biasing of the output but may not be useful to compensate for the decoder's drop.

In various examples, the drop in the voltage of a transistor can be negated by biasing a current provided to gate of a transistor of the sensing circuitry. A drop of the voltage can be negated by merging a target voltage (e.g., target voltage of a gate of a transistor) and a voltage substantially equal to the voltage drop of a decoder. The merged voltage can be provided to the gate of the transistor. Merging voltages including the target voltage and a voltage drop can be referred to as biasing a voltage. For instance, the gate voltage of a transistor can be biased by merging a drop voltage with the gate voltage. Increasing the gate voltage of a transistor can result in a current increase in the output of the memory cell, which can compensate for a voltage drop experienced by a decoder comprising the memory cell.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory device 103. The system 100 can include separate integrated circuits, or both the host 102 and the memory device 103 can be on the same integrated circuit. For example, the host 102 may be a system controller of a memory system comprising multiple memory devices 103, with the system controller 102 providing access to the respective memory devices 103 by another processing resource such as a central processing unit (CPU). The host 102 can also be an artificial intelligence (AI) chip configured for AI processing.

In the example shown in FIG. 1, the host 102 is responsible for executing an operating system (OS) and/or various applications that can be loaded thereto (e.g., from memory device 103 via controller 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the system 100 has been simplified to focus on features with particular relevance to the present disclosure. The memory array 110 can be an array of self-selecting memory (SSM) array or a 3D cross-point memory array, for instance. The array 110 can comprise memory cells arranged in rows coupled by select lines (which may be referred to in the art as word lines or access lines) and columns coupled by sense lines (which may be referred to in the art as digit lines, data lines, or bit lines). Although a single array 110 is shown in FIG. 1, embodiments are not so limited. For instance, memory device 103 may include a number of arrays 110 (e.g., a number of banks of DRAM cells).

The memory cells that comprise the memory array 110 may be resistance variable memory cells such as SSM and/or 3D cross-point memory, for example. The memory cells may include a material programmable to different data states. In some examples, each of memory cells may include a single material, between a top electrode (e.g., top plate) and a bottom electrode (e.g., bottom plate), that may serve as a select element (e.g., a switching material) and a storage element, so that each memory cell may act as both a selector device and a memory element. Such a memory cell may be referred to herein as an SSM cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer. Memory cells may also include, for 3D cross-point memory, a plurality of materials (e.g., a first material and a second material), between a top electrode (e.g., top plate) and a bottom electrode (e.g., bottom plate), that may serve as a select element (e.g., a switching material) and a storage element, so that each memory cell may act as both a selector device and a memory element.

In various embodiments, the threshold voltages of memory cells and/or transistors of a decoder of a sensing circuitry may snap back in response to a magnitude of an applied voltage differential across them exceeding their threshold voltages. Such memory cells may be referred to as snapback memory cells. For example, a memory cell may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 110 may be referred to as a cross-point architecture in which a memory cell is formed at a topological cross-point between a word line and a bit line. Such a cross-point architecture may offer relatively high-density data storage with lower production costs compared to other memory architectures. For example, the cross-point architecture may have memory cells with a reduced area and, resultantly, an increased memory cell density compared to other architectures.

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z, cache coherent interconnect for accelerators (CCIX), or the like. Address signals are received and decoded by a row decoder 108 and a column decoder 112 to access the memory array 110. Data can be read from memory array 110 by sensing voltage and/or current changes on the sense lines using sensing circuitry 111. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller, which is coupled to a processing resource of a computing device.

Upon accessing, a memory cell may be read, or sensed, by the sensing circuitry 111 to determine the programmed state of the memory cell. For example, a voltage may be applied to a memory cell (using the corresponding select line and sense line) and the presence of a resulting current through the memory cell may depend on the applied voltage and the threshold voltage of the memory cell.

The current output by the memory cell may be transmitted by sense lines and/or select lines to the sensing circuitry 111. The sensing circuitry 111 can receive the current from the memory cell and can provide the received current to a transistor of the sensing circuitry 111. The transistor can also be a resistance variable transistor as described above. The transistor can be included in a decoder of the sensing circuitry 111. The decoder that receives the current at a transistor can be internal to the sensing circuitry 111.

The decoder can decode the signal provided at the transistor to generate an output. The output signal of the decoder can experience a current drop due to the decoding performed by the decoder. The current drop can affect the transistor such that the sensing circuitry 111 may incorrectly sense a state of a memory cell of the memory array.

To compensate for the current drop experienced by the memory cell of the memory array 110, the sensing circuitry 111 can include a current mirror configured to provide a current that is substantially equal to the current received from the memory cell(s) of the memory array 110. The current mirror can provide the current to the transistor and to a replica of the decoder. The decoder replica can be circuitry configured to replicate a decoder comprising the transistor. The decoder replica can be used to determine a voltage drop that is experienced by an actual decoder. The decoder replica can provide a voltage equal to the voltage drop experienced by the decoder. The voltage drop can be combined (e.g., merged) with a target voltage that is provided to the transistor of the decoder to compensate for the voltage drop that is experienced by the decoder. Adding the voltage that is substantially equal to the voltage drop to the target voltage can allow for the sensing circuitry 111 to correctly sense a state of the memory cell of the memory array 110.

Figure 2:
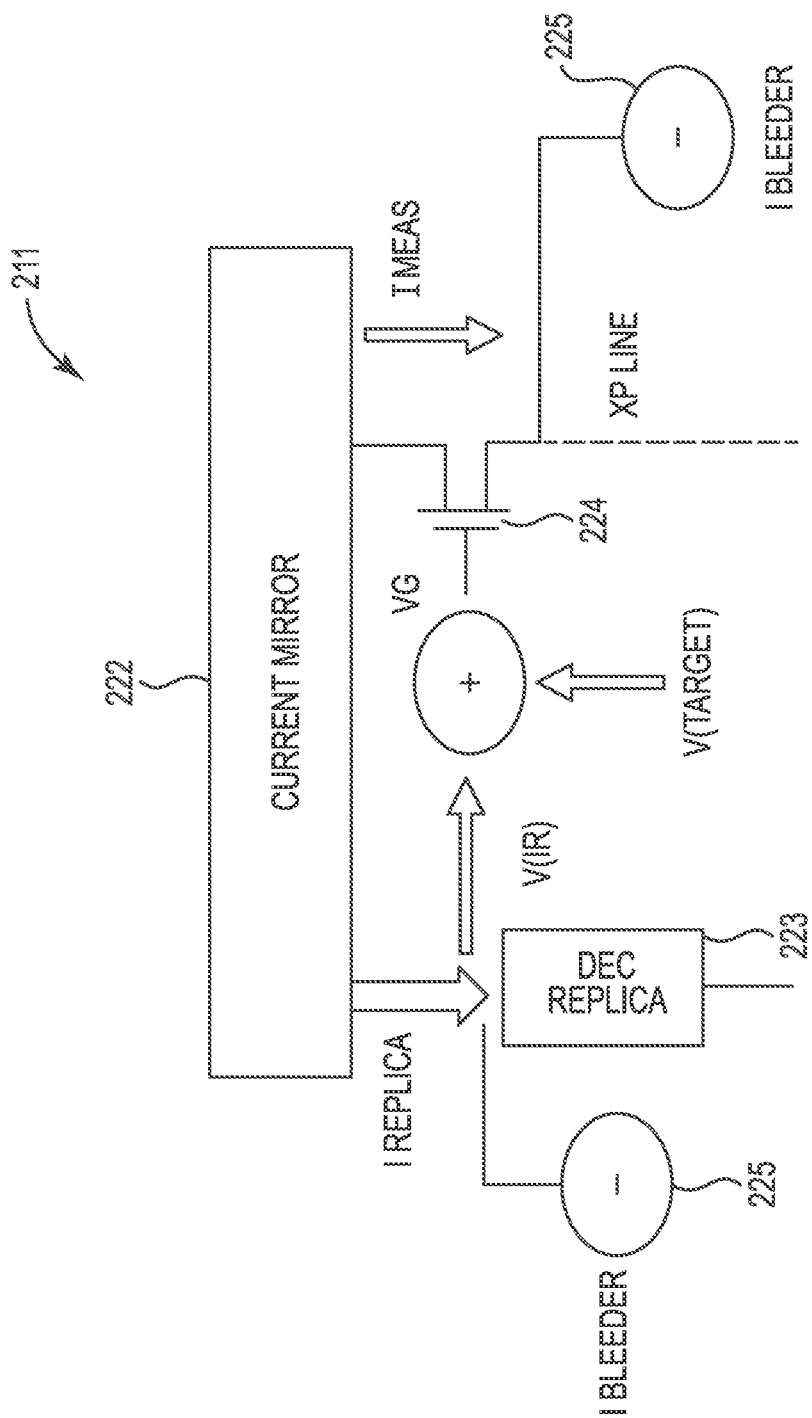
FIG. 2 is a block diagram of sensing circuitry in accordance with a number of embodiments of the present disclosure.

FIG. 2 is a block diagram of sensing circuitry 211 in accordance with a number of embodiments of the present disclosure. The sensing circuitry 211 can include a current mirror 222, a decoder replica 223, a transistor 224, and bleeder circuitry 225, among other possible components.

The current mirror 222 can comprise circuitry configured to replicate a current provided via a sense line and/or a select line of a memory array. The current mirror 222 can comprise a capacitor configured to store a charge that can be used to replicate a current. As used herein, "replicating a current" describes the process of providing a current (e.g., replica current) that is substantially equal to a current (e.g., line current) and/or is based on the current (e.g., line current) provided by a memory array.

The current mirror 222 can provide the replica current to the transistor 224 of the decoder replica 223. The decoder replica 223 can be circuitry configured to replicate a decoder implemented in the sensing circuitry. The current drop experienced by the decoder can be experienced by the decoder replica 223. That is, the decoder replica 223 provides the ability to replicate a current drop experienced by the decoder. The decoder replica 223 can also replicate a voltage drop experienced by the decoder.

The transistor 224 can receive the replica current at a first terminal and can provide an output current via a second terminal. The transistor 224 can receive a target voltage (e.g., V(Target)) at the gate. A voltage (e.g., V(IR)) representing the voltage drop experienced by the decoder replica 223 and/or the decoder can be combined with the target voltage. Providing a combined voltage to the gate of the transistor 224 can compensate for the current drop experienced by the decoder.

The bleeder circuitry 225 can bleed the replica voltage and the output provided by the transistor 224. For example, the bleeder circuitry 225 can be coupled to a decoder replica and/or a line providing the voltage representing the voltage drop to the transistor 224. The bleeder circuitry 225 can also be coupled to a line that provides the output of the transistor 224.

The bleeder circuitry 225 can also be used to stabilize the line (e.g., XP line) that provides an output of the transistor 224. The line (e.g., XP line) can also be referred to as a sense line or a select line of the memory array, for example. The line can be stabilized in case of leakage. The bleeder circuitry 225 can comprise a single bleeder circuitry 225 and/or can comprise multiple instances of the bleeder circuitry 225. For example, different bleeder circuitry 225 can be implemented for the decoder replica 223 and the line that provides an output of the transistor 224. In various examples, a same bleeder circuitry 225 can be implemented for the decoder replica 223 and the line that provides an output of the transistor 224.

In various examples, the relationship between the current mirror 222, the transistor 224, and the decoder replica 223, can be referred to as a current feedback loop. The loop can characterize the current that originates from the current mirror 222 and flows to the decoder replica 223 and the transistor 224 and/or the current that flows from the decoder replica 223 to the transistor 224.

In various examples, the current mirror 222 may have a current mirror ratio that is less than 1 to improve settling time. After calibration, the combined voltage (VG) provided to the transistor 224 can be kept in a sample and hold state by a switch and capacitance.

A number of advantages of the examples described herein can include adjusting a voltage based on a resistance experienced by the transistor 224. Adjusting the voltage can also allow the decoder to realize an accurate amplification.

FIGS. 3A-E are schematics of sensing circuitry 311 in accordance with a number of embodiments of the present disclosure. FIGS. 3A-E include a current mirror 322, a decoder replica 323, a snap detector 337, precharge circuitry 331, switch 334, and reference circuitry 335, among other possible components. A sense line (DL) can be coupled to a number of memory cells in a memory array. The sense line can be used to sense a particular one of the memory cells by operation of a select line coupled to the particular memory cell. In various examples, the sensing circuitry 311 can be controlled by a controller 105 in FIG. 1. The controller 102 can control the signals provided to the different components of the sensing circuitry 311.

Figure 3A:
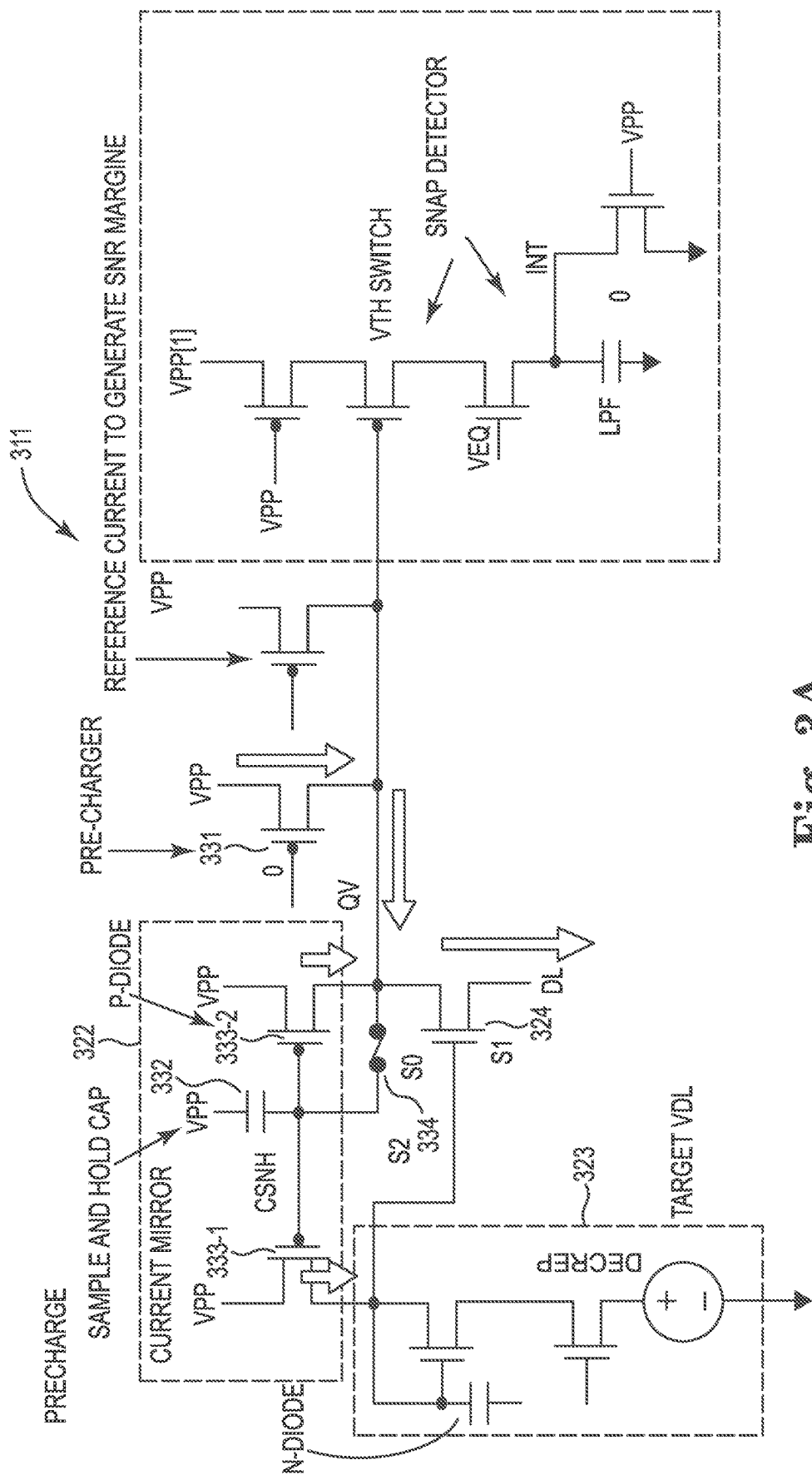
FIG. 3A is a schematic of sensing circuitry during a precharge operation in accordance with a number of embodiments of the present disclosure.

FIG. 3A shows the precharging of the sense line, during which the current mirror 322 does not function to truly mirror the sense line current to the decoder replica 323. To precharge the sense line, the switch 334 can be closed. The switch 334 is an electrical component that can disconnect or connect the conducting path of an electrical current, interrupt the electrical current, or divert the electrical current. The precharge current that flows through the precharge circuitry 331 can be provided to the sense line and to the current mirror 322 via a switch 334, by virtue of the switch 334 being in a closed state.

The precharge circuitry 331 can allow a precharge current to flow therethrough. For example, the precharge circuitry 331 can include a P-type metal oxide semiconductor (PMOS) transistor with one terminal coupled to a power supply voltage (VPP) and one terminal coupled to the node labeled QV. A gate of the transistor can be controlled with a first signal ("0") such that the precharge current flows therethrough to the QV node. The gate of the transistor can be controlled with a second signal (VPP) such that the precharge current does not flow therethrough.

The current mirror 322 is circuitry configured such that a current of the same or substantially the same magnitude exists for both of the decoder replica 323 and the sense line. The current mirror 322 can comprise a capacitor 332 (e.g., "sample and hold capacitor") and a plurality of transistors such as a first transistor 333-1 and a second transistor 333-2, referred to generally as transistors 333. A first terminal of each of the transistors 333 can be coupled to a supply voltage (VPP). A second terminal of the transistor 333-1 can be coupled to the decoder replica 323. A second terminal of the second transistor 333-2 can be coupled to the QV node.

The current mirror 322 can receive the precharge current at the capacitor 332. The capacitor 332 can be charged by the precharge current. The capacitor 332 can be commonly coupled to a respective gate of each of the transistors 333 and to the switch 334. Accordingly, the gates of the transistors 333 can have a signal applied thereto while the capacitor 332 is being charged. This can cause the transistors 333 to have weak conduction across their channels as illustrated by the small arrows.

In various examples, the decoder replica 323 can comprise an N-type cascode. However, the examples described herein can be applied to a decoder replica comprising a P-type cascode. The current provided from the current mirror 322 can be described as having a coarse regulation given that the precharge circuitry 331 is active.

Figure 3B:
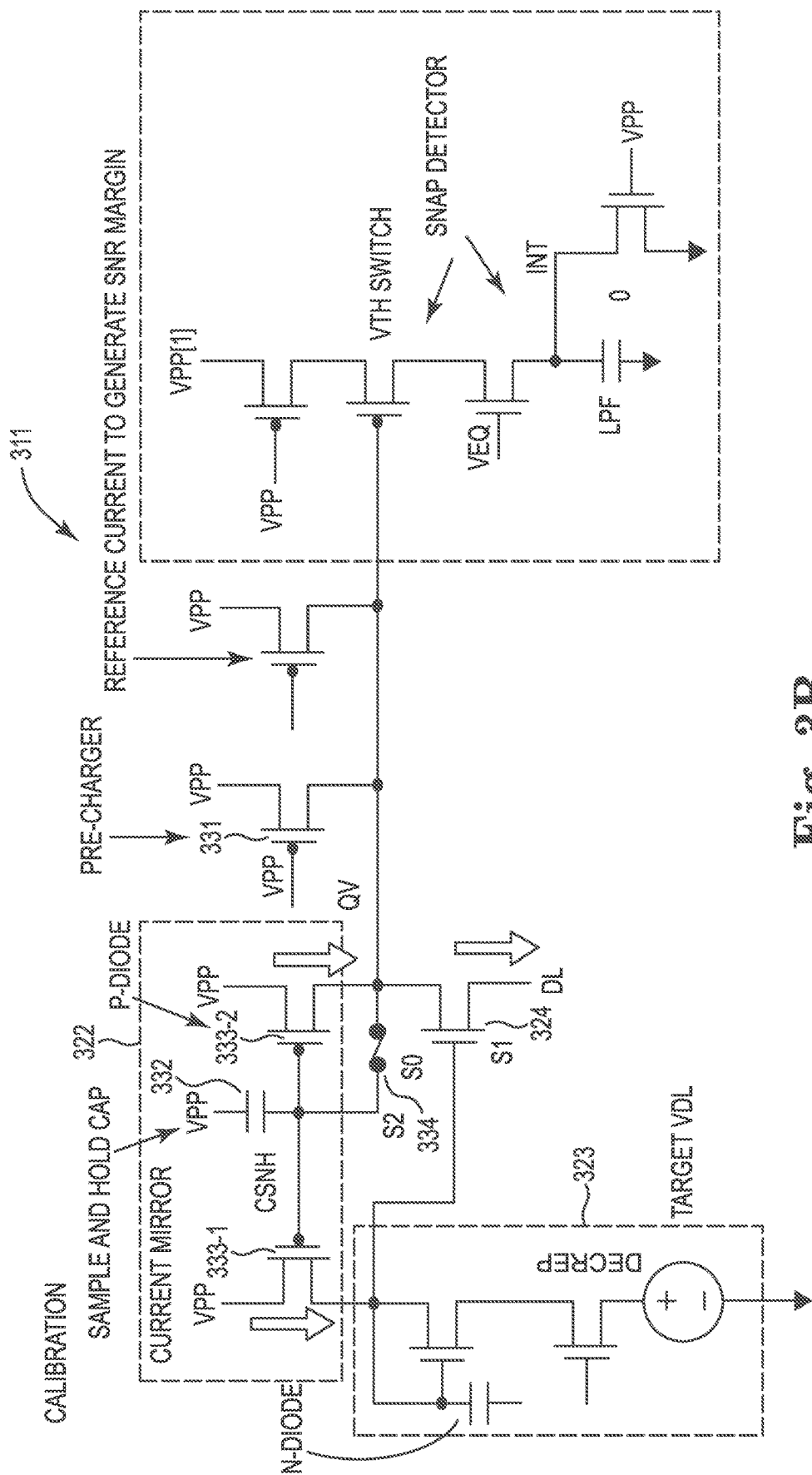
FIG. 3B is a schematic of sensing circuitry during a calibration operation in accordance with a number of embodiments of the present disclosure.

FIG. 3B shows the calibration of the sense line. The sense line can be calibrated following the precharging of the sense line and the capacitor 332. The sense line can be calibrated by turning off the precharge circuitry 331 (e.g., preventing a current from flowing through the transistor of the precharge circuitry 331). For example, the gate of the transistor 331 can have a power supply voltage (VPP) applied thereto, which can cause the precharge circuitry 331 not to conduct. Turning off the precharge circuitry 331 can cause the current mirror 322 to bias the sense line as desired and as illustrated in FIG. 3B.

The switch 334 can remain closed while the sense line is calibrated. The precharged capacitor 332 can cause a voltage to be applied to the gates of the transistors 333. The current mirror 322 can thereby adapt the sense line to the desired voltage (e.g., the sense line can be balanced with the decoder replica 323 as indicated by the arrows of equal length on both sides of the current mirror 322).

Figure 3C:
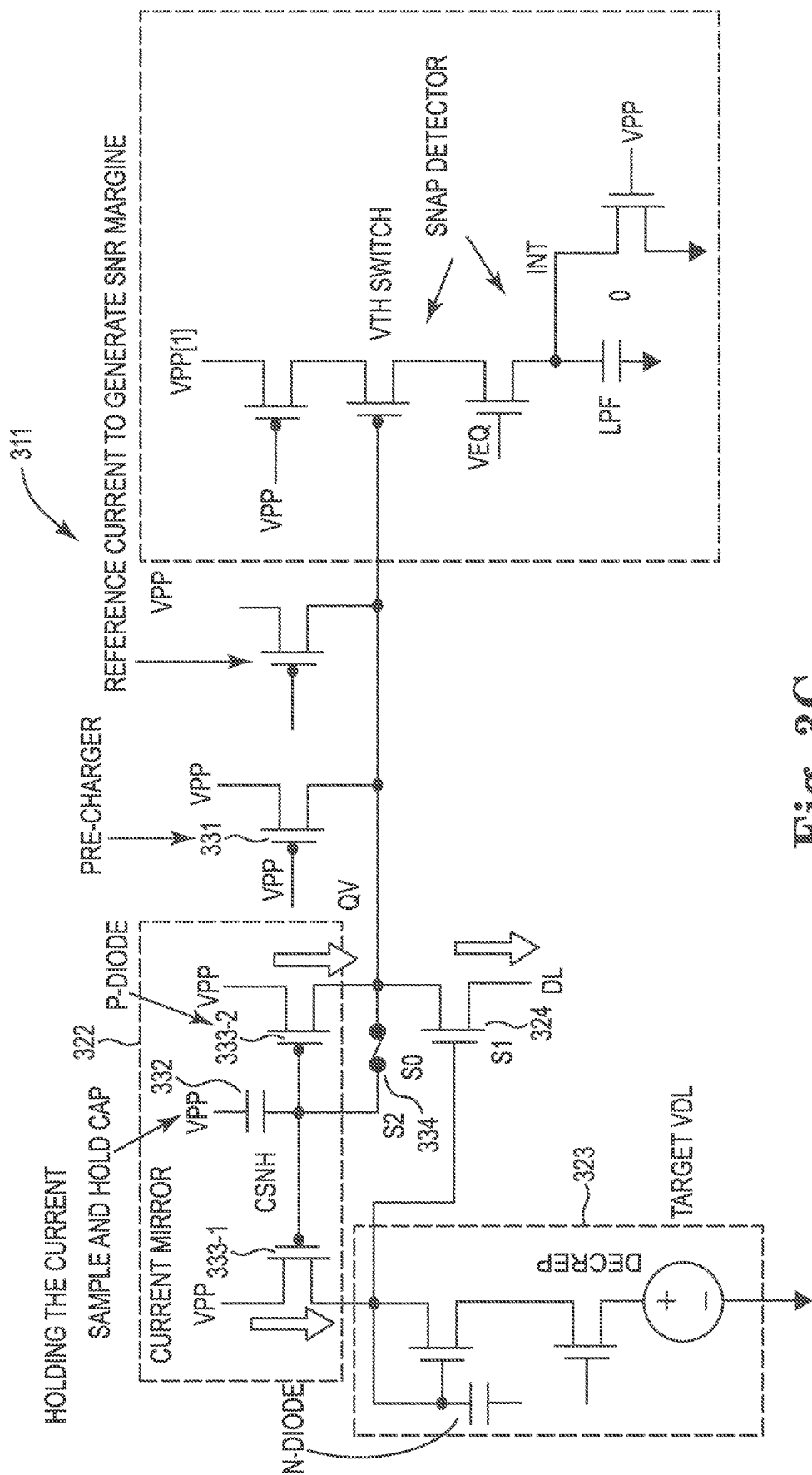
FIG. 3C is a schematic of sensing circuitry during a hold operation in accordance with a number of embodiments of the present disclosure.

FIG. 3C shows holding the current on the sense line. The switch 334 can be opened to prevent the capacitor 332 from discharging through the sense line. The precharge circuitry 331 can remain off. Given that no signal is provided to the sense line from the precharge circuitry 331, the current mirror 322 can effectively mirror a current so that its magnitude is equal or substantially equal on both the sense line and the decoder replica 323. The transistors 333 have a same supply voltage (VPP) applied to their first terminals and a same gate voltage from the capacitor 332 applied to their gates, thus having a same gate-to-source voltage (VGS). The second transistor 333-2 can function to cause the current on the sense line to be mirrored to the decoder replica 323 by the current mirror 322. The decoder replica 323 can function as a cascode replica biased by the sense line current.

While a current is provided to the transistor 324 from the current mirror 322, the decoder replica 323 can provide a current corresponding to the voltage drop experienced by the decoder replica 323. As used herein, the transistor 324 and the precharge circuitry 331 can comprise the decoder of the sensing circuitry. The current corresponding to the voltage drop experienced by the decode replica 323 can be referred to as a drop current. The drop current can be combined with a target current of the gate of the transistor 324. The target current and the drop current can be combined by an N-diode. The combined current can be provided to the gate of the transistor 324, which can cause the biasing of the current provided via the sense line.

Figure 3D:
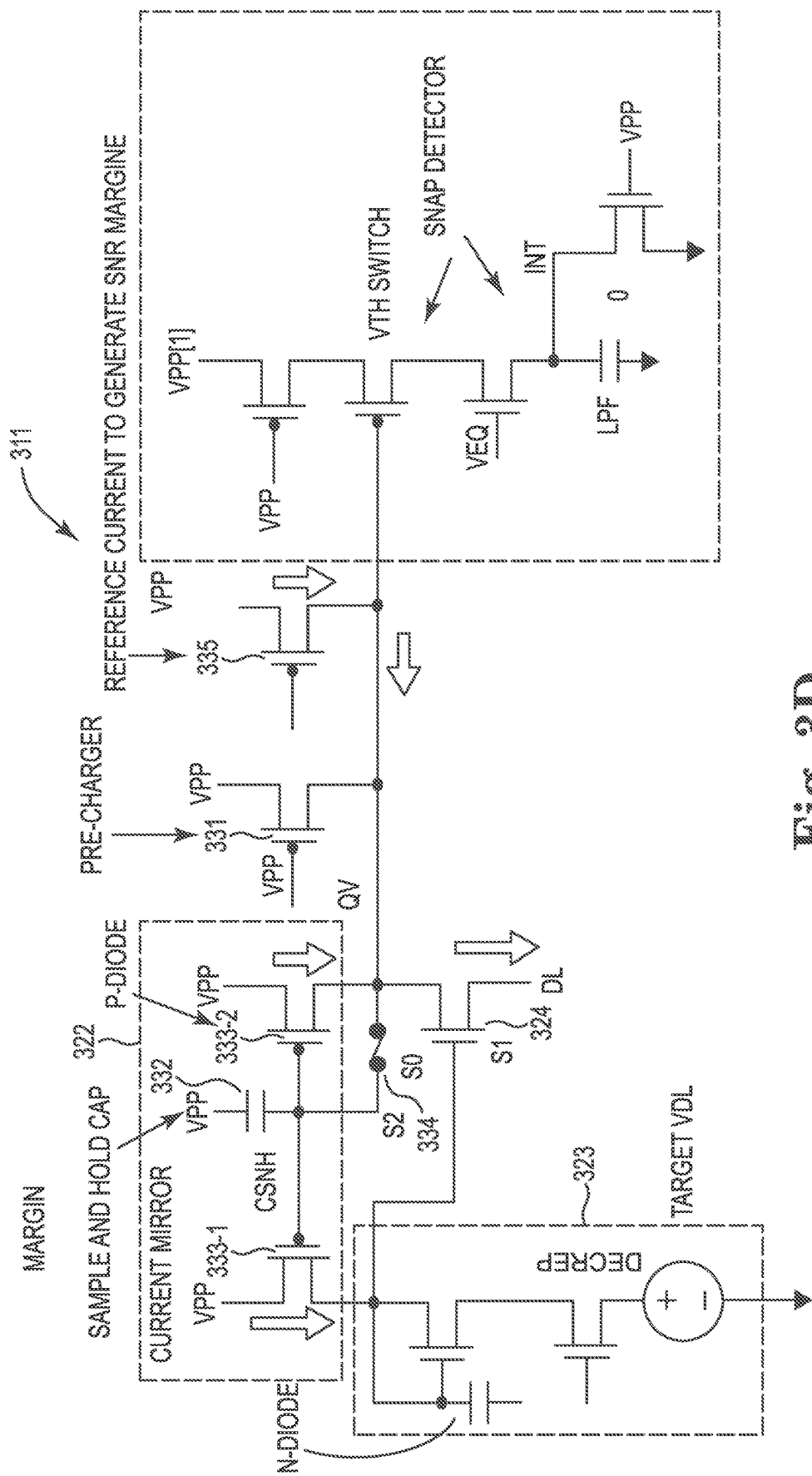
FIG. 3D is a schematic of sensing circuitry during a margin operation in accordance with a number of embodiments of the present disclosure.

FIG. 3D shows the addition of a margin current to the current on the sense line. The margin current is provided via reference circuitry 335 (e.g., a PMOS transistor). The margin current can be added to improve a signal-to-noise ratio (SNR) for the sensing circuitry. An SNR is a measure that compares a level of a desired signal to the level of background noise.

A first terminal of a transistor of the reference circuitry 335 can be coupled to a power supply (VPP). When the reference circuitry 335 is turned on, the margin current can be provided to the QV node and to the sense line. The switch 334 can remain open during the addition of the margin current. In various examples, the margin current can be used to improve SNR, however embodiments are not so limited. Some embodiments perform sensing operations without the addition of the margin current.

Figure 3E:
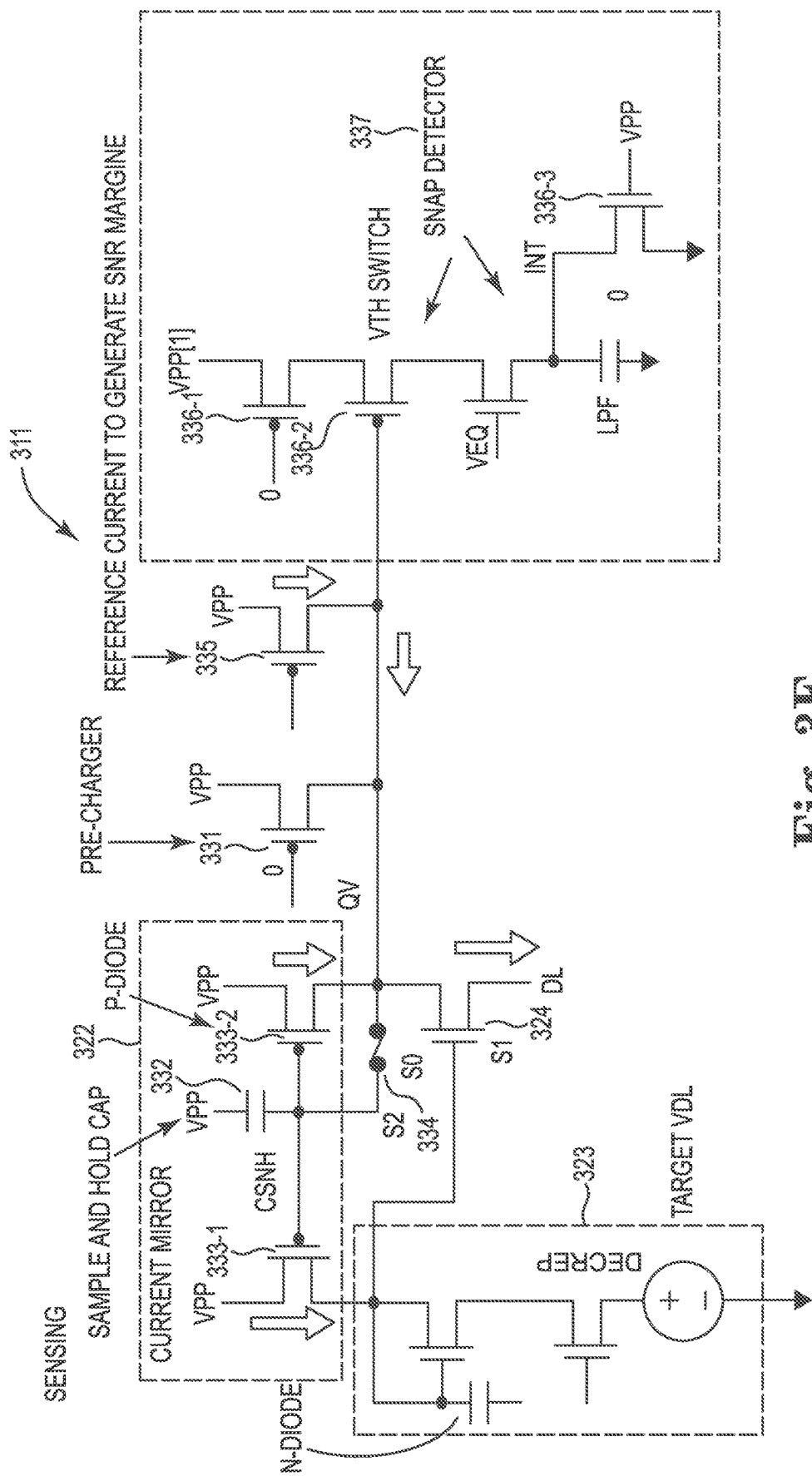
FIG. 3E is a schematic of sensing circuitry during a sense operation in accordance with a number of embodiments of the present disclosure.

FIG. 3E shows the sensing of a memory cell. The snap detector 337 can be used to sense the state of a memory cell of the memory array and/or the transistor 324. The memory state can be sensed by measuring the DL current and converted by the DL current into a measurable voltage by the snap detector 337. The snap detector 337 can comprise a plurality of transistors including transistors 336-1, 336-2, and 336-3. The transistors 336-1, 336-2, and 336-3 can be referred to as transistors 336. The snap detector 337 can be configured to sense the state of the transistor 324 using the transistors 336. The transistor 336-2 can couple the snap detector 337 to the current mirror 322. As such, the mirror current or the merged current (e.g., mirror current merged with margin current) can be provided to the snap detector 337. Accordingly, the transistor 336-1 and/or the transistor 336-2 can be utilized to activate the snap detector 337.

Upon firing of the select line the snap detector will amplify the sense line voltage. The amplified sense line voltage can drop if the transistor 324 is in a Set state or may not move if the transistor 324 is in a Reset state, or the transistor's current is lower than the reference margin applied after compensation. Snap events can be captured by a capacitor. A capacitor can be charged or discharged as a consequence of the snap events turning on a PMOS (NMOS) switch.

Figure 4:
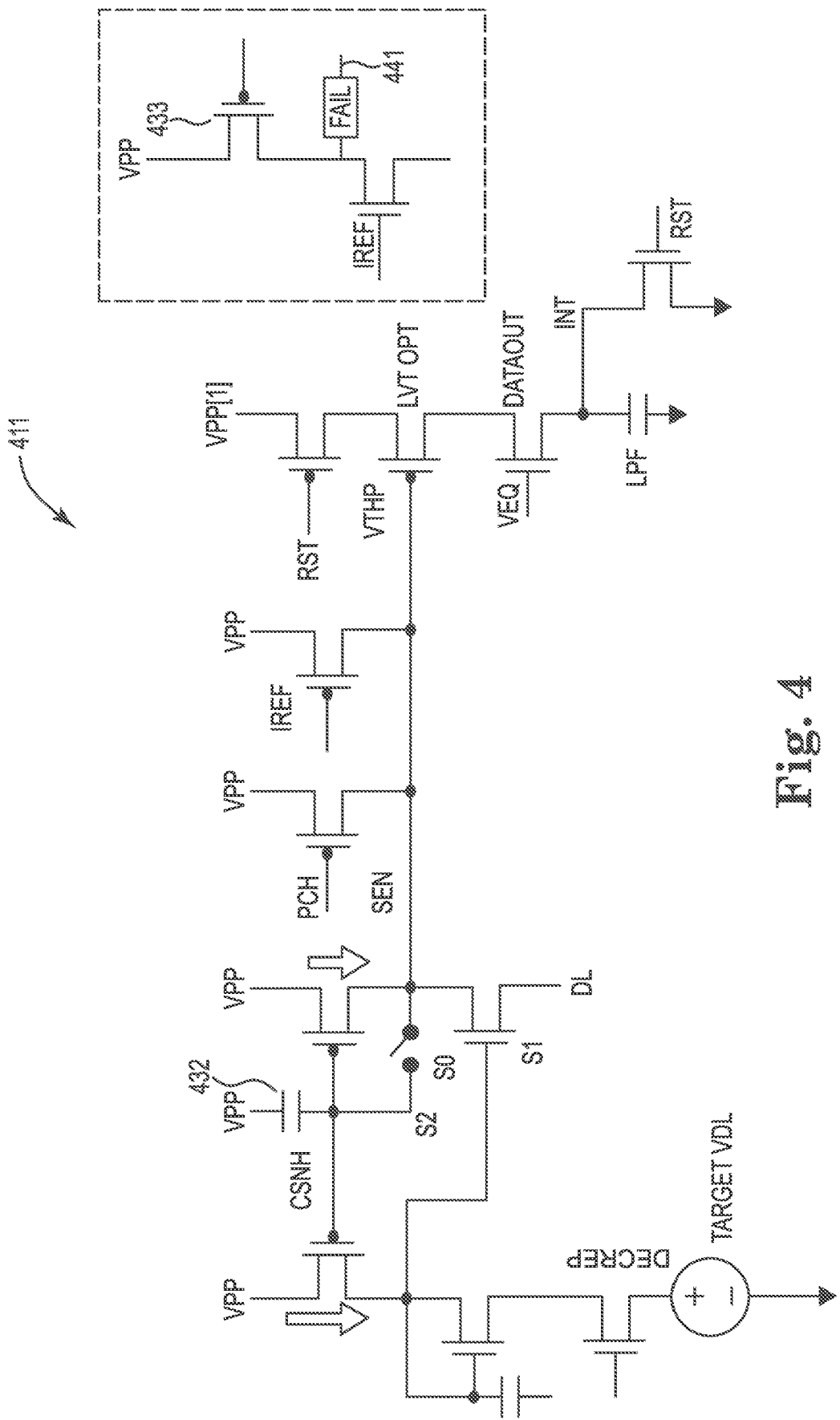
FIG. 4 is a schematic of sensing circuitry during fail detection in accordance with a number of embodiments of the present disclosure.

FIG. 4 is a schematic of sensing circuitry 411 during fail detection in accordance with a number of embodiments of the present disclosure. The structure of the sensing circuitry 411 can be as described in FIG. 3A but with the addition of fail circuitry 441. As used herein, fail circuitry 441 comprises circuitry configured to determine if a voltage drop experienced by the decoder replica and/or the decoder is greater than a threshold. The fail circuitry 441 is coupled to a terminal of the transistor 433, which is part of the current mirror. The transistor 433 is analogous to transistor 333-1 of FIG. 3A.

The fail circuitry 441 can provide signals to the controller that can be utilized to determine that the voltage drop of a decoder is greater than threshold. The fail circuitry 441 can determine if a voltage drop is greater than a threshold before a select line is fired.

The controller can utilize the signals provided by the fail circuitry 441 to mark memory cells of the memory array for repair, where the memory cells are coupled to the sense line that provided the signals to the sensing circuitry 411. The repairs to the memory cells can be performed in a media maintenance cycle. As used herein, the term media maintenance cycle describes a duration of time in which maintenance can be performed on media including a memory system and/or a memory device.

The controller can utilize the signals provided by the fail circuitry 441 to set a plurality of registers. In various examples, the plurality of registers can comprise SRAM and/or a different type of memory. The register can be incorporated into controller or can be external to the controller but internal to the memory device.

Determining if a voltage drop is greater than a threshold may not require additional sensing time given that the determination can be made during a current compensation phase. The current compensation phase can include a time prior to firing the select line. In various examples, the determination can be made during a calibration of the sense line.

Figure 5:
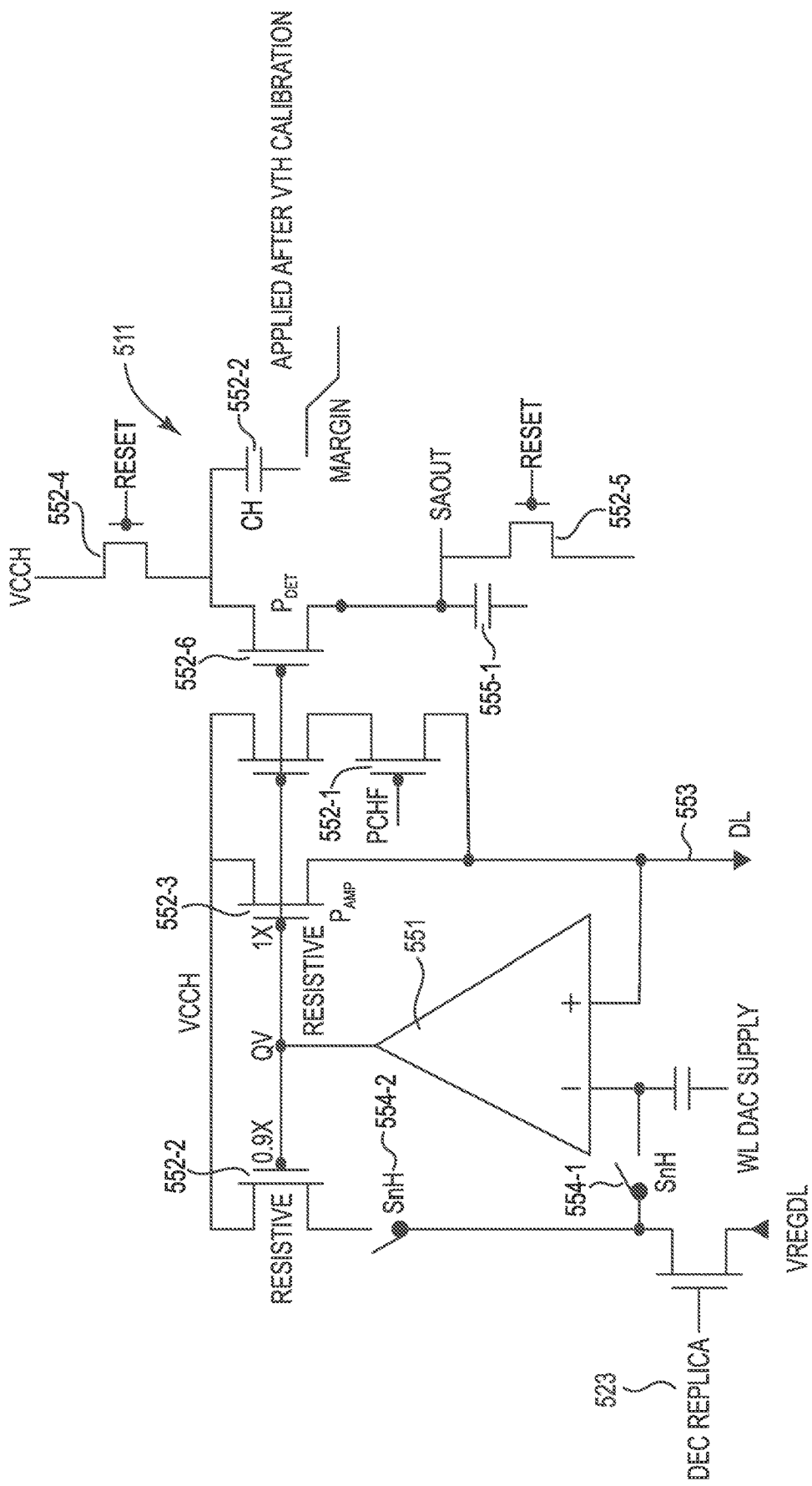
FIG. 5 is a schematic of sensing circuitry including a feedback amplifier in accordance with a number of embodiments of the present disclosure.

FIG. 5 is a schematic of sensing circuitry 511 including a feedback amplifier in accordance with a number of embodiments of the present disclosure. In the examples of FIG. 5, the cascode-based bias of the DL 553 can be replaced with an operational amplifier (opamp) based bias of the DL 553. Implementing an opamp based bias of the DL 553 can be a faster solution which is operating at lower voltages (e.g., does not utilize a VTH on top of the DL target value, does not spend a VTH to mirror the current) than the cascode-based bias.

After being sense enable, a short and high current digit line pulse, while transistor 552 (e.g., PCHF) is low, is provided to the DL 553 to have a majority of the displacement charge vanished and not mirrored into the replica. Once the DL 553 is settled close enough to its final value, with transistor 552 (e.g., PCHF) is high, the opamp 551 begins to supply the leakage current.

The opamp 551 can supply the leakage current by biasing the transistor 552-3 (e.g., RESISTIVE 1X pmos gate labeled QV (VGS set for leakage, VGS=QV-VCCH)). The VCCH current can be mirrored with a slightly less ratio (0.9×) into the decoder replica 523 until the plus and minus of the opamp are virtually equalized. The VCCH current can be mirrored into the decoder replica 523 using the transistor 552-2.

Mirroring the VCCH current at a lesser ratio (e.g., 0.9×) than VCCH can include using an extra voltage provided to the opamp 551 at the negative terminal. Providing the extra voltage can result in a higher DL (plus) voltage (compensating for the voltage drop due to leakage). The switches 554-1, 554-2 (e.g., switches SnH) can be opened and a capacitance can hold a regulated voltage on the minus terminal. Using a capacitance to provide a regulated voltage to the opamp 551 can save power for sensing circuitry 511.

The transistor 52-2, 552-3 (e.g., RESISTIVE mos) can be chosen to develop a QV voltage (e.g., large QV voltage) to supply the cell current while a lower ratio is chosen for stability purposes. The WL DAC SUPPLY is a stable ground. The WL DAC supply can be VSS.

For a detector stage and during standby, a capacitor 555-1 (e.g., SAOUT capacitor) is reset to ground using the transistor 552-5 (e.g., reset transistor) while the capacitor 555-2 (e.g., CH capacitor) is pre-charged at VCCH using the transistor 552-4. After the sampling, when a memory cell coupled to the sensing circuitry 511 is accessed (e.g., SET cell, switched on), the current requested is provided by the opamp 511 by lowering the QV to increase the output of the transistors 552-2 and 552-3. The lower QV can also turn on the transistor 552-6, (e.g., PDET mos) which charges the capacitor 555-1. Resetting a corresponding memory cells may not include any current other than leakage currante. The QV can remain high enough and transistor 552-6 may not be activated. To create a margin on the detector to noise, the capacitance 555-2, after the detector precharge, is boosted with a margin voltage. In this way QV can be slightly lower to turn on the transistor 552-1 in case the cell is a SET state.

In various instances, the transistor 552-1 can be part of a precharge circuitry. The transistor 552-2 and 552-3 can be utilized to provide a mirrored current. The decoder replica 523 can be analogous to the decoder replica 323 of FIG. 3. The switches 554-1, 554-2 can be analogous to switch 334.

Figure 6:
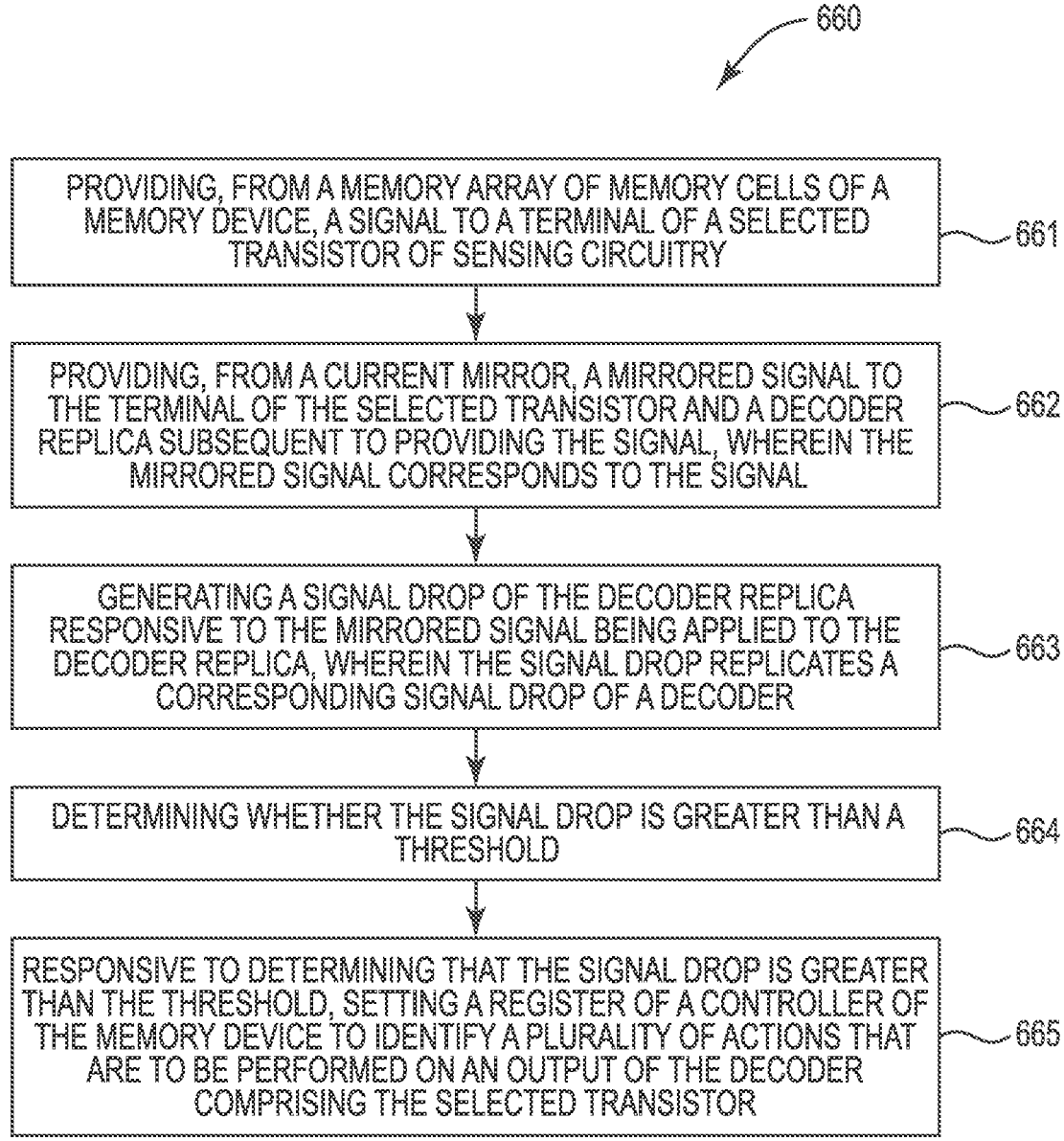
FIG. 6 illustrates an example flow diagram of a method for signal drop compensation in memory in accordance with a number of embodiments of the present disclosure.

FIG. 6 illustrates an example flow diagram of a method 660 for signal drop compensation in memory in accordance with a number of embodiments of the present disclosure.

At 661, a signal can be provided, from an array of memory cells of a memory device to a terminal of a selected transistor of sensing circuitry. The signal can be provided to the selected transistor via a sense line. The selected transistor is analogous to the transistor 324 in FIG. 3. At 662, a mirrored signal can be provided from a current mirror to the terminal of the selected transistor and a decoder replica subsequent to providing the signal. The mirrored signal can correspond to the signal. For example, the mirrored signal can replicate the signal.

At 663, a signal drop of the decoder replica can be generated responsive to the mirrored signal being applied to the decoder replica. The signal drop can replicate a corresponding signal drop of a decoder. The decoder replica can replicate the decoder. The decoder can comprise the selected transistor.

At 664, a determination can be made as to whether the signal drop is greater than a threshold. The threshold can indicate that memory cells of the memory array and/or a decoder are experiencing errors. At 665, responsive to determining that the signal drop is greater than the threshold, a register of a controller of the memory device can be set to identify a plurality of actions that are to be performed on an output of the decoder comprising the selected transistor. In various examples, the plurality of actions can be performed on the memory cells of the memory array that are associated with the sense line and/or the decoder.

In various examples, the register of the controller of the memory device can be set to cause a plurality of error correction code (ECC) operations to be performed on the output of the decoder. The register of the controller of the memory device can also be set to activate wear leveling or set wear leveling attributes for the memory device. The method can include storing an address corresponding to the signal to set the register. The ECC operations can be performed on signals originating from memory cells having the address.

The ECC operations can include error erasure operations. As used herein, error erasure operations can include forward error correction code under the assumption of bit erasure that transforms a message of X symbols into a longer message with Y symbols such that the original message can be recovered from a subset of the Y symbols. Responsive to setting the register, a plurality of actions can be performed during a media maintenance cycle of the memory array. In various examples, the selected transistor can be a 3D crosspoint memory cell.

The sensing circuitry can be configured to apply a first signal to a terminal of a particular transistor where the particular transistor is coupled to a sense line that is coupled to a memory array. The first signal can be mirrored to a decoder replica. A second signal can be applied to a gate of the particular transistor, the second signal comprising a sensing signal and a signal drop on the decoder replica. A state of the particular transistor can be sensed.

The decoder replica can replicate a decoder of the sensing circuitry. The decoder replica can be part of a current feedback loop. The current feedback loop can have a small positive gain (less than one) to provide system stability. The sensing circuitry can be configured to bleed an output of a second terminal of the particular transistor to stabilize a sense line coupled to the second terminal. The particular transistor can be stabilized by bleeding the positive gain of the current feedback loop. The sensing circuitry can bleed the mirrored first signal analogously to the output of the second terminal.

In various examples, the sensing circuitry can be coupled to the memory array and can comprise a decoder, a decoder replica, and a current mirror. The decoder can be coupled to the memory array. The decoder replica, which replicates the decoder, can be coupled to the memory array. A current mirror can be coupled to the decoder replica and to the array. The current mirror can be configured to provide a signal to a terminal of a selected transistor and a mirrored signal to the decoder replica. The decoder replica can be configured to provide a signal drop of the decoder replica to a gate of the selected transistor responsive to the mirrored signal being applied to the decoder replica, wherein the signal drop replicates a corresponding signal drop of the decoder. The sensing circuitry can further be configured to provide a sensing signal to the gate of the selected transistor simultaneously with the signal drop provided by the decoder replica and sense a state of the selected transistor.

The current mirror can comprise a capacitor. The sensing circuitry can comprise precharge circuitry coupled to a sense line via the selected transistor and to the capacitor. The precharge circuitry can be configured to simultaneously precharge the sense line and the capacitor. The sensing circuitry can further comprise a switch coupled between the capacitor and the precharge circuitry. The switch can be closed to precharge the capacitor. The current mirror can further comprise a first transistor coupled to the capacitor via a gate of the first transistor and configured to provide the signal to the selected transistor and a second transistor coupled to the capacitor via a gate of the second transistor and configured to provide the mirrored signal to the decoder replica.

The sensing circuitry can further be configured to precharge the capacitor by providing a precharge signal to a third transistor. The third transistor can be configured to provide the precharge signal to the selected transistor and the switch coupling the capacitor to the third transistor. The sensing circuitry can further be configured to precharge the capacitor by closing the switch to provide the precharge signal to the capacitor.

The sensing circuitry is configured to calibrate the selected transistor by configuring the third transistor to refrain from providing the precharge signal to the selected transistor and the switch coupling the capacitor to the third transistor, wherein the switch is closed.

The capacitor is configured to provide an activation signal to the gate of the first transistor to cause the first transistor to provide the signal to the selected transistor. The capacitor can also be configured to provide the activation signal to the gate of the second transistor to cause the second transistor to provide the mirrored signal to the decoder replica.

The sensing circuitry can be configured to hold the signal by configuring the third transistor to refrain from providing the precharge signal to selected transistor and the switch coupling the capacitor to the third transistor and wherein the switch is open. The capacitor can further be configured to provide the activation signal to the gate of the first transistor to cause the first transistor to provide the signal to the selected transistor. The capacitor can also be configured to provide the activation signal to the gate of the second transistor to cause the second transistor to provide the mirrored signal to the decoder replica.

The sensing circuitry is configured to configure the third transistor to refrain from providing the precharge signal to the transistor and the switch coupling the capacitor to the third transistor, wherein the switch is open. The capacitor can be further configured to provide the activation signal to the gate of the first transistor to cause the first transistor to provide the signal to the selected transistor. The capacitor can further provide the activation signal to the gate of the second transistor to cause the second transistor to provide the mirrored signal to the decoder replica. A fourth a fourth transistor can be configured to provide a reference signal to the terminal of the selected transistor simultaneously with the signal. The simultaneous provision of the reference signal and the signal generates an improved signal-to-noise ratio margin for sensing.

The sensing circuitry can also be configured to sense the selected transistor by configuring the third transistor to refrain from providing the precharge signal to the selected transistor and the switch coupling the capacitor to the third transistor. The switch can be open. The capacitor can further be configured to provide the activation signal to the gate of the first transistor to cause the first transistor to provide the signal to the selected transistor and provide the activation signal to the gate of the second transistor to cause the second transistor to provide the signal to the decoder replica. The decoder replica can also be configured to provide the signal drop to the gate of the selected transistor. The signal drop can be provided simultaneously with the sensing signal. The sensing circuitry can also comprise a snap detector configured to receive a detector activation signal and responsive to receipt of the detector activation signal, detect a state of the selected transistor. The snap detector activation signal can be received by the transistor 336-1 of FIG. 3.

Figure 7:
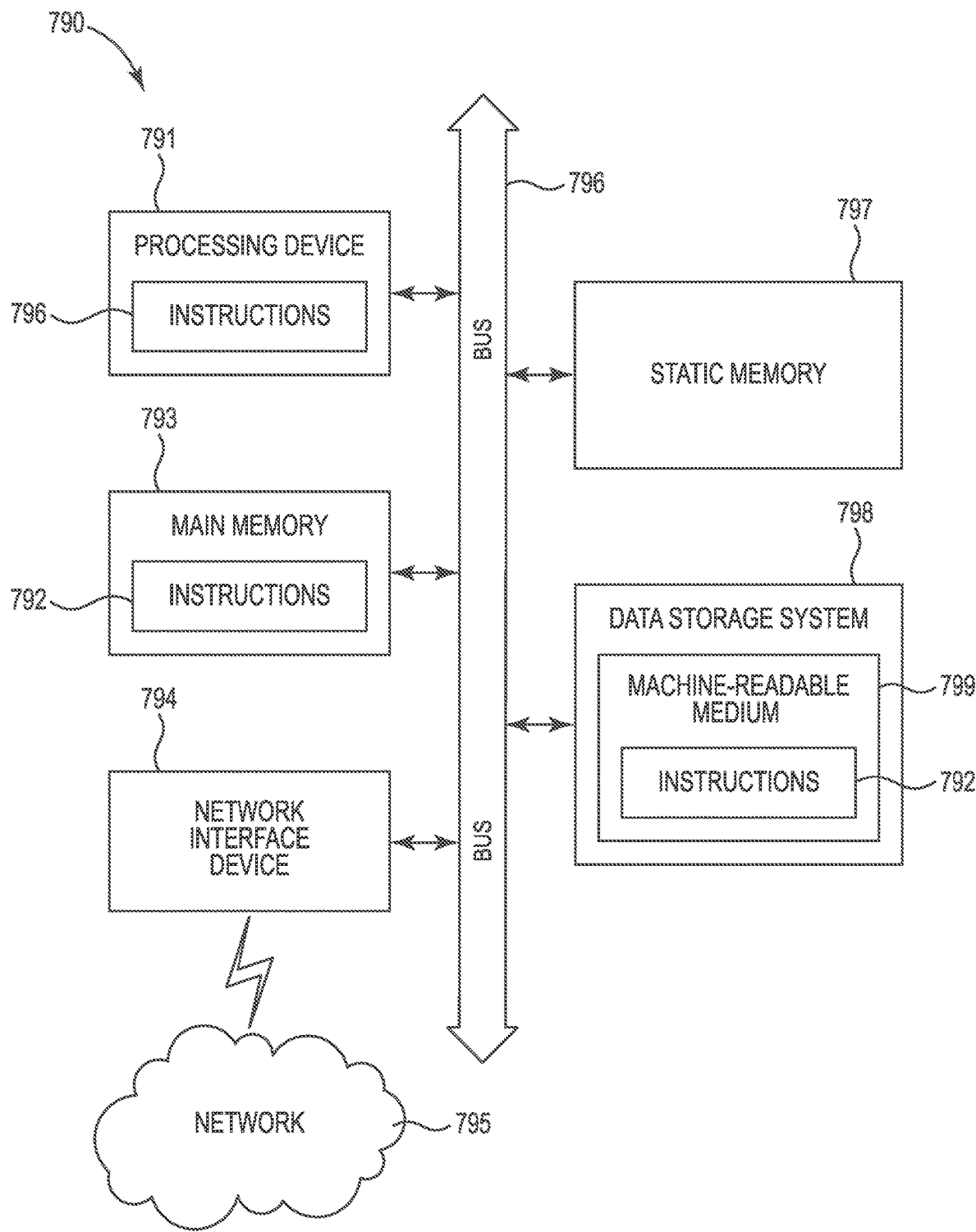
FIG. 7 illustrates an example machine of a computer system within which a set of instructions, for causing the machine to perform various methodologies discussed herein, can be executed.

FIG. 7 illustrates an example machine of a computer system 740 within which a set of instructions, for causing the machine to perform various methodologies discussed herein, can be executed. In various embodiments, the computer system 740 can correspond to a system (e.g., the system 100 of FIG. 1) that includes, is coupled to, or utilizes a memory sub-system (e.g., the memory device 103 of FIG. 1) or can be used to perform the operations of a controller (e.g., the controller 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 740 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 740 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 740, the main memory 704 and the processing device 702 also constituting machine-readable storage media.

In one embodiment, the instructions 726 include instructions to implement functionality corresponding to the host 102 and/or the memory device 103 of FIG. 1. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a memory array comprising memory cells;
    sensing circuitry coupled to the memory array and configured to:
        apply a first signal to a terminal of a particular transistor;
        mirror the first signal to a decoder replica;

apply a second signal to a gate of the particular transistor, the second signal comprising a sensing signal and a signal drop on the decoder replica; and
sense a state of the particular transistor.

2. The apparatus of claim 1, wherein the decoder replica replicates a decoder of the sensing circuitry, and wherein the decoder replica is part of a current feedback loop.

3. The apparatus of claim 2, wherein the current feedback loop has a positive gain.

4. The apparatus of claim 3, wherein the sensing circuitry is configured to bleed an output of a second terminal of the particular transistor to stabilize a sense line coupled to the second terminal.

5. The apparatus of claim 4, wherein the sensing circuitry is configured to bleed the mirrored first signal analogously to the output of the second terminal.

6. An apparatus, comprising:
a memory array comprising memory cells;
sensing circuitry coupled to the memory array and comprising:
a decoder coupled to the memory array;
a decoder replica, which replicates the decoder, coupled to the memory array; and
a current mirror coupled to the decoder replica and to the memory array, wherein the current mirror is configured to provide a signal to a terminal of a selected transistor and a mirrored signal to the decoder replica;
wherein the decoder replica is configured to provide a signal drop of the decoder replica to a gate of the selected transistor responsive to the mirrored signal being applied to the decoder replica, wherein the signal drop replicates a corresponding signal drop of the decoder;
wherein the sensing circuitry is configured to:
provide a sensing signal to the gate of the selected transistor simultaneously with the signal drop provided by the decoder replica; and
sense a state of the selected transistor.

7. The apparatus of claim 6, wherein the current mirror comprises a capacitor; and
wherein the sensing circuitry comprises precharge circuitry coupled to a sense line via the selected transistor and to the capacitor;
wherein the precharge circuitry is configured to simultaneously precharge the sense line and the capacitor.

8. The apparatus of claim 7, wherein the sensing circuitry comprises a switch coupled between the capacitor and the precharge circuitry; and
wherein the sensing circuitry is configured to close the switch to precharge the capacitor.

9. The apparatus of claim 8, wherein the current mirror further comprises:
a first transistor coupled to the capacitor via a gate of the first transistor and configured to provide the signal to the selected transistor; and
a second transistor coupled to the capacitor via a gate of the second transistor and configured to provide the mirrored signal to the decoder replica.

10. The apparatus of claim 9, wherein the sensing circuitry is configured to precharge the capacitor by:
providing a precharge signal to a third transistor, and
wherein the third transistor is configured to provide the precharge signal to the selected transistor and the switch coupling the capacitor to the third transistor.

11. The apparatus of claim 10, wherein the sensing circuitry is configured to precharge the capacitor by closing the switch to provide the precharge signal to the capacitor.

12. The apparatus of claim 9, wherein the sensing circuitry is configured to calibrate the selected transistor by:
configuring the third transistor to refrain from providing the precharge signal to the selected transistor and the switch coupling the capacitor to the third transistor, wherein the switch is closed.

13. The apparatus of claim 9, wherein the capacitor is configured to:
provide an activation signal to the gate of the first transistor to cause the first transistor to provide the signal to the selected transistor; and
provide the activation signal to the gate of the second transistor to cause the second transistor to provide the mirrored signal to the decoder replica.

14. The apparatus of claim 9, wherein the sensing circuitry is configured to hold the signal by:
configuring the third transistor to refrain from providing the precharge signal to the selected transistor and the switch coupling the capacitor to the third transistor and wherein the switch is open; and
wherein the capacitor is configured to:
provide the activation signal to the gate of the first transistor to cause the first transistor to provide the signal to the selected transistor; and
provide the activation signal to the gate of the second transistor to cause the second transistor to provide the mirrored signal to the decoder replica.

15. The apparatus of claim 9, wherein the sensing circuitry is configured to:
configure the third transistor to refrain from providing the precharge signal to the selected transistor and the switch coupling the capacitor to the third transistor, wherein the switch is open; and
wherein the capacitor is configured to:
provide the activation signal to the gate of the first transistor to cause the first transistor to provide the signal to the selected transistor; and
provide the activation signal to the gate of the second transistor to cause the second transistor to provide the mirrored signal to the decoder replica; and
configure a fourth transistor to provide a reference signal to the terminal of the selected transistor simultaneously with the signal.

16. The apparatus of claim 9, wherein the sensing circuitry is configured to sense the selected transistor by:
configuring the third transistor to refrain from providing the precharge signal to the selected transistor and the switch coupling the capacitor to the third transistor, wherein the switch is open; and
wherein the capacitor is configured to:
provide the activation signal to the gate of the first transistor to cause the first transistor to provide the signal to the selected transistor;
provide the activation signal to the gate of the second transistor to cause the second transistor to provide the signal to the decoder replica;
wherein the decoder replica is configured to provide the signal drop to the gate of the selected transistor, wherein the signal drop is provided simultaneously with the sensing signal; and
wherein the sensing circuitry further comprises a snap detector configured to:
receive a detector activation signal; and responsive to receipt of the detector activation signal, detect a state of the selected transistor.

17. A method, comprising:

providing, from a memory array of memory cells of a memory device, a signal to a terminal of a selected transistor of sensing circuitry;

providing, from a current mirror, a mirrored signal to the terminal of the selected transistor and a decoder replica subsequent to providing the signal, wherein the mirrored signal corresponds to the signal;

generating a signal drop of the decoder replica responsive to the mirrored signal being applied to the decoder replica, wherein the signal drop replicates a corresponding signal drop of a decoder;

determining whether the signal drop is greater than a threshold; and responsive to determining that the signal drop is greater than the threshold, setting a register of a controller of the memory device to identify a plurality of actions that are to be performed on an output of the decoder comprising the selected transistor.

18. The method of claim 17, further comprising setting the register of the controller of the memory device to cause a plurality of error correction code (ECC) operations to be performed on the output of the decoder.

19. The method of claim 18, wherein setting the register further comprises storing an address corresponding to the signal and wherein the ECC operations are performed on signals originating from memory cells having the address.

20. The method of claim 18, wherein the ECC operations include error erasure operations.

21. The method of claim 17, further comprising, responsive to setting the register, performing the plurality of actions during a media maintenance cycle of the memory array.

* * * * *